(12) United States Patent
He et al.

(10) Patent No.: US 8,049,113 B2
(45) Date of Patent: Nov. 1, 2011

(54) PRINTED CIRCUIT BOARDS

(75) Inventors: Dong-Qing He, Shenzhen (CN); Ming Wang, Shenzhen (CN); Chih-Yi Tu, Taoyuan (TW); Cheng-Hsien Lin, Taoyuan (TW)

(73) Assignees: FuKui Precision Component (Shenzhen) Co., Ltd., Shenzhen (CN); Zhen Ding Technology Co., Ltd., Tayuan, Taoyuan (TW)

( * ) Notice: Subject to any disclaimer, the term of this patent is extended or adjusted under 35 U.S.C. 154(b) by 903 days.

(21) Appl. No.: 12/047,152

(22) Filed: Mar. 12, 2008

(65) Prior Publication Data
US 2008/0283289 A1 Nov. 20, 2008

(30) Foreign Application Priority Data

May 18, 2007 (CN) .......................... 2007 1 0074364

(51) Int. Cl.
*H05K 1/02* (2006.01)
(52) U.S. Cl. ........................................ 174/255; 174/261
(58) Field of Classification Search .................. 174/255, 174/261, 268
See application file for complete search history.

(56) References Cited

U.S. PATENT DOCUMENTS

| | | | | |
|---|---|---|---|---|
| 6,404,064 | B1 * | 6/2002 | Tsai et al. ...................... | 257/779 |
| 7,116,208 | B2 * | 10/2006 | Nishimura et al. ........... | 337/296 |
| 2008/0100411 | A1 * | 5/2008 | Tofigh et al. .................. | 337/163 |
| 2009/0016036 | A1 * | 1/2009 | Wong et al. .................... | 361/768 |

FOREIGN PATENT DOCUMENTS

| | | |
|---|---|---|
| JP | 3157547 | 4/2001 |
| TW | 493362 | 7/2002 |
| TW | I254439 | 5/2006 |
| WO | WO 98/44769 | * 10/1998 |

* cited by examiner

*Primary Examiner* — Chau Nguyen
(74) *Attorney, Agent, or Firm* — Altis Law Group, Inc.

(57) ABSTRACT

The present invention relates to a printed circuit board. In one embodiment, a printed circuit board includes a dielectric layer and a conductive trace formed on the dielectric layer. The conductive layer includes a first conductive portion, a connecting portion and a second conductive portion. The connecting portion includes a first end and a second end. The first end is connected to the first conductive portion; the second end is connected to the second conductive portion. A width of the connecting portion gradually decreases from the first end to the second end. Reflection and cross talk of signals transmitted in the presented printed circuit board can be reduced.

2 Claims, 6 Drawing Sheets

PRINTED CIRCUIT BOARDS

BACKGROUND

1. Technical Field

The present invention relates to printed circuit boards and, particularly, to printed circuit boards with reduced impedance mismatch.

2. Discussion of Related Art

Typically, printed circuit boards include at least one non-conductive sheet with at least one dielectric layer formed on a surface of the non-conductive sheet. Many types of conductive traces, for example, transmission lines and circuit terminals, can be formed in the conductive layer. The transmission lines and the circuit terminals may be interconnected.

FIG. 6 shows a typical structure of conductive trace, in which a first transmission line 41 and a second transmission line 42 having different widths are directly connected with each other. Generally, the depth of the first transmission line 41 equals to the depth of the second transmission line 42. Due to the difference in widths, the first transmission line 41 and the second transmission line 42 have different impedances. In other words, the different widths cause impedance mismatch between the first transmission line 41 and the second transmission line 42. The impedance mismatch in printed circuit boards, especially in high-speed printed circuit boards may cause various problems, such as signal reflection, cross talk, signal retardance, etc.

Therefore it is desired to develop a printed circuit board that can reduce impedance mismatch between transmission lines and circuit terminals or other transmission lines.

SUMMARY

In one embodiment, a printed circuit board includes a dielectric layer and a conductive trace formed on the dielectric layer. The conductive layer includes a first conductive portion, a connecting portion and a second conductive portion formed therein. The connecting portion includes a first end and a second end. The first end is connected to the first conductive portion; the second end is connected to the second conductive portion. A width of the connecting portion gradually decreases from the first end to the second end.

BRIEF DESCRIPTION OF THE DRAWINGS

Many aspects of the present printed circuit board can be better understood with reference to the following drawings. The components in the drawings are not necessarily drawn to scale, the emphasis instead being placed upon clearly illustrating the principles of the present printed circuit board.

DETAILED DESCRIPTION OF THE PREFERRED EMBODIMENTS

Figure 1:
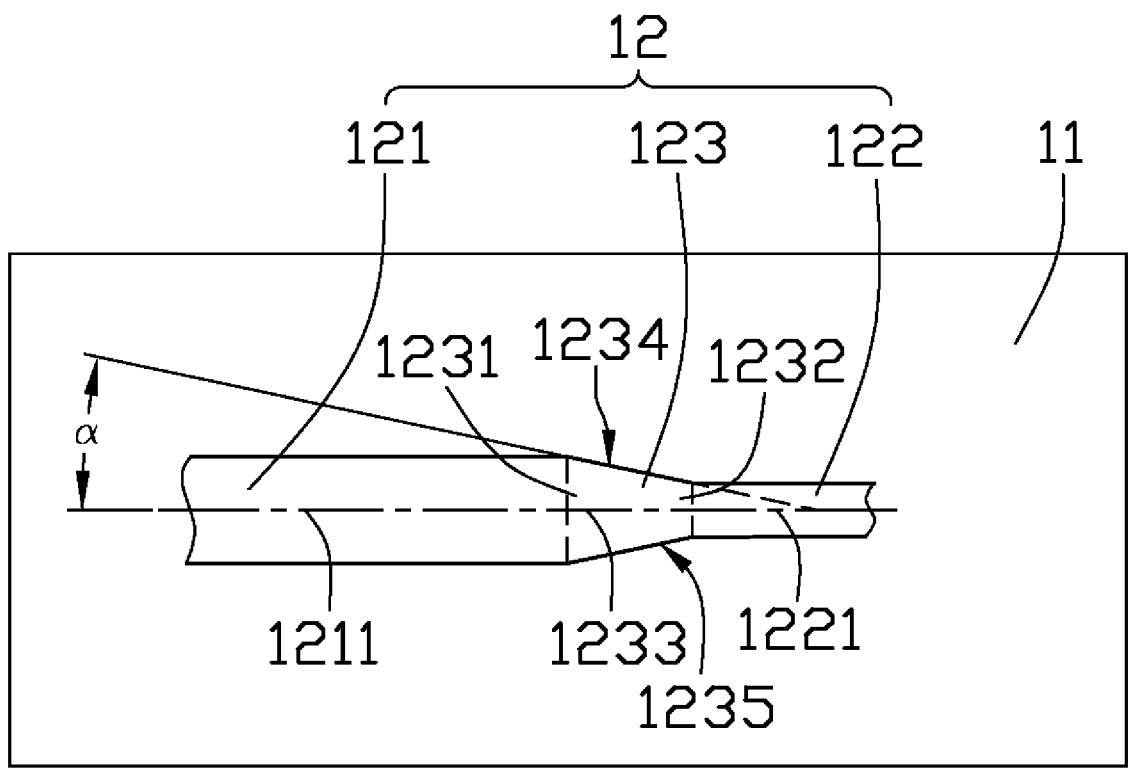
FIG. 1 is a schematic view showing a printed circuit board in accordance with a first embodiment.
Figure 2:
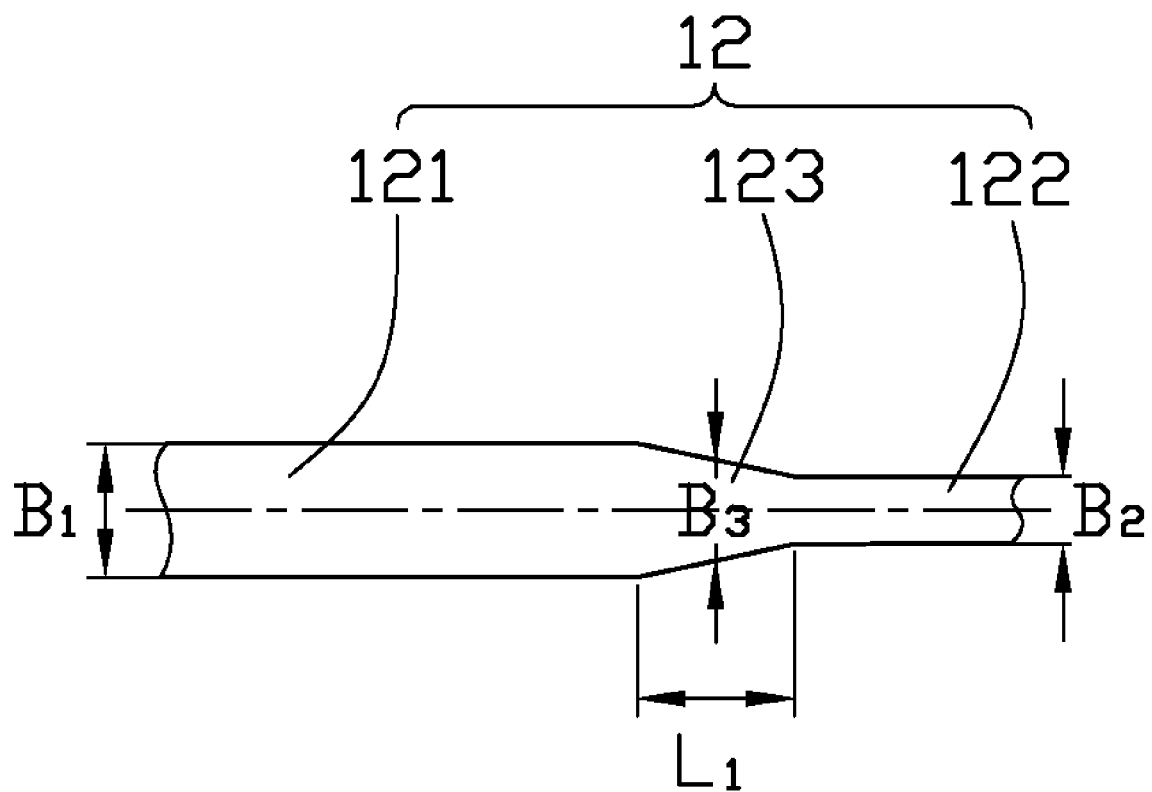
FIG. 2 is a schematic view showing a printed circuit board in accordance with a first embodiment.

Referring to FIG. 1, a printed circuit board 10 in accordance with a first preferred embodiment includes a dielectric layer 11 and a conductive trace 12 formed on the dielectric layer 11. The conductive trace 12 includes a first conductive portion 121, a connecting portion 123, and a second conductive portion 122. The connecting portion 123 includes a first end 1231 and a second end 1232. The first end 1231 is connected to the first conductive portion 121 and the second end 1232 is connected to the second conductive portion 122.

In the first preferred embodiment, the first conductive portion 121 and the second conductive portion 122 are transmission lines. The first conductive portion 121, the second conductive portion 122, and the connecting portion 123 define a central axis 1211, a central axis 1221, and a central axis 1233 respectively. The conductive trace 12 is substantially axially symmetrical. In other words, the central axes 1211, 1221, 1233 lie in a same line.

The first conductive portion 121 has a width of $W_1$ and the second conductive portion 122 has a width of $W_2$. The width $W_1$ of the first conductive portion 121 is larger than the width $W_2$ of the second conductive portion 122. A width of the first end 1231 of the connecting portion 123 substantially equals to $W_1$ and a width of the second end 1232 of the connecting portion 123 substantially equals to $W_2$. A width of the connecting portion gradually decreases from the first end 1231 to the second end 1232. Specifically, in the first preferred embodiment, $W_1$=4 mils (1 mil=1/1000 inches) and $W_2$=2 mils.

The connecting portion 123 includes two sidewalls 1234, 1235 adjacent to the dielectric layer 11. The sidewalls 1234, 1235 are on opposite sides of the connecting portion 123. Each of the sidewalls 1234, 1235 extends directly (straightly) from the first conductive portion 121 to the second conductive portion 122. Furthermore, each of the sidewalls 1234, 1235 extends from the first conductive portion 121 to the second conductive portion 122 at an acute angle α relative to the central axis 1233. The acute angle α is in a range from about 37° to about 54.5°. Preferably, the acute angle α is in the range from about 40° to about 49°.

The connecting portion 123 has a length of $L_1$ along a direction of the central axis 1233, i.e., the length $L_1$ equals to the shortest distance between the first end 1231 and the second end 1232. The length $L_1$ of the connecting portion 123 can be calculated using the width $W_1$ of the first conductive portion 121 and the width $W_2$ of the second conductive portion 122. Specifically, $L_1$ is in the range from $1.6*(W_1-W_2)$ to $2.4*(W_1-W_2)$. Preferably, $L_1$ is in the range from $1.8*(W_1-W_2)$ to $2.2*(W_1-W_2)$.

In the first preferred embodiment, $L_1$ equals to $2.2*(W_1-W_2)$, that is, $L_1$=4.4 mils. Because the width of the connecting portion 123 gradually decreases from the first end 1231 to the second end 1232, a variable $W_3$ is used to represent the width of the connecting portion 123 at any point of the connecting portion 123. The width $W_3$ of the connecting portion 123 at a predetermined point can be calculated using a formula $W_2+2X*\tan(\alpha)$, wherein X represents a distance from the second end 1232 to the predetermined point of the connecting portion 123.

In these embodiments, the first conductive portion 121 and the second conductive portion 122 are connected to the first end 1231 and the second end 1232 of the connecting portion respectively. Furthermore a width of the connecting portion 123 gradually decreases form the first end 1231 to the second end 1232. As a result, impedance mismatch between the first conductive portion 121 and the second conductive portion 122 can be reduced/minimized, in addition, signal reflection and cross talk can also be reduced.

Figure 3:
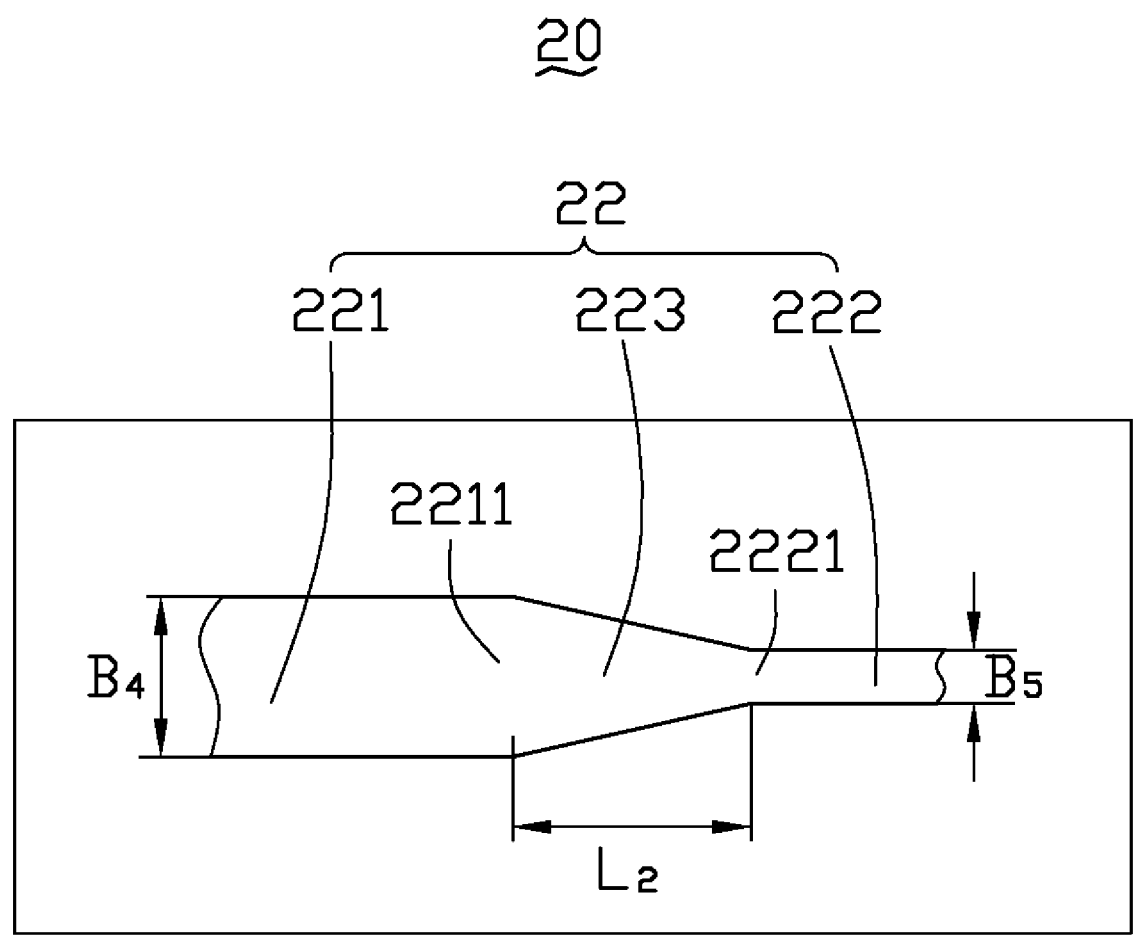
FIG. 3 is a schematic view showing a printed circuit board in accordance with a second embodiment.

Referring to FIG. 3, a printed circuit board 20 in accordance with a second embodiment is similar to that of the first embodiment. The printed circuit board 20 includes a first conductive portion 221, a connecting portion 223, and a second conductive portion 222. The connecting portion 223 includes a first end 2211, and a second end 2221. A width of the connecting portion 223 gradually decreases from the first end 2211 to the second end 2221. A width of the first conductive portion 221 is represented by a variable $W_4$. A width of the second conductive portion 222 is represented by a variable $W_5$. A length of the connecting portion 223 is represented by a variable $L_2$. In the second embodiment, $W_4=6$ mils, $W_5=2$ mils, and $L_2=1.9*(W_4-W_5)$, that is, $L_2=7.6$ mils.

Figure 4:
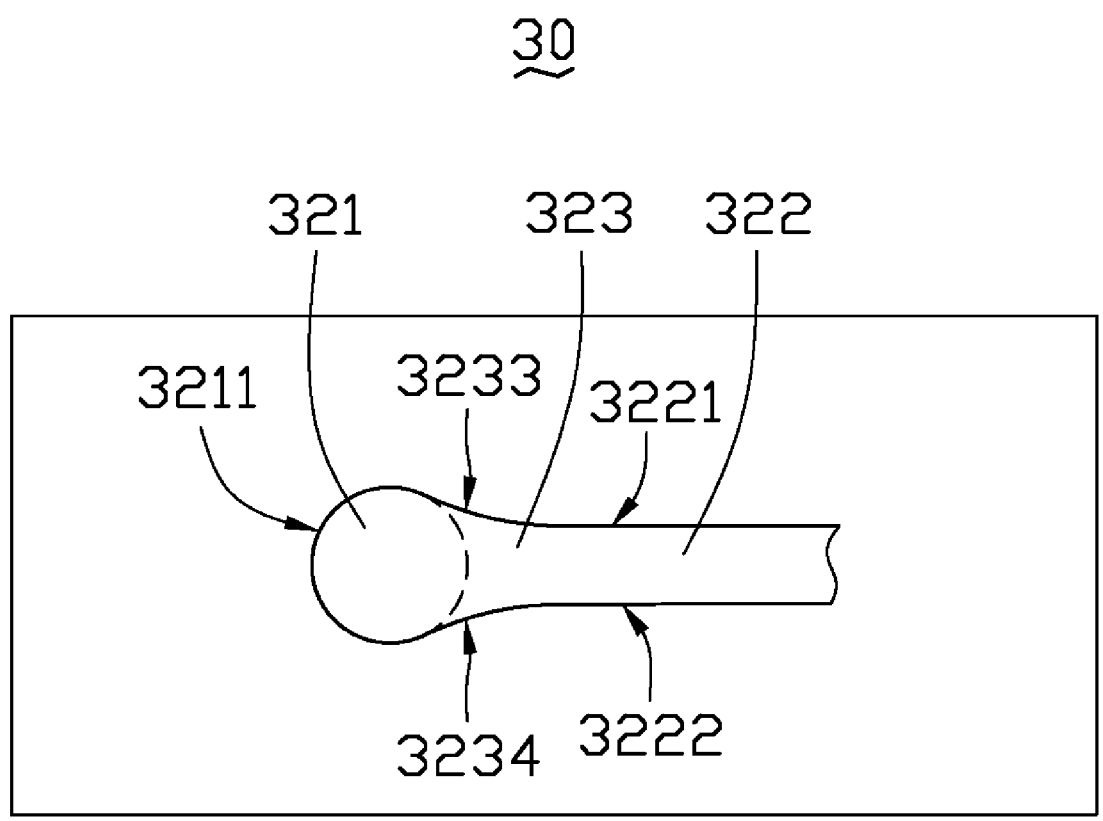
FIG. 4 is a schematic view showing a printed circuit board in accordance with a third embodiment.

Referring to FIG. 4, a printed circuit board 30 in accordance with a third embodiment is similar to that of the first embodiment. The printed circuit board 30 includes a first conductive portion 321, a second conductive portion 322, and a connecting portion 323. The first conductive portion 321 is a circular shaped welding pad, which has an arc-shaped sidewall 3211. The second conductive portion 322 is a transmission line, which has two sidewalls 3221, 3222 on opposite sides of the second conductive portion 322. The connecting portion 323 includes two sidewalls 3233, 3234 on opposite sides of the connecting portion 323. The sidewall 3233 of the connecting portion 322 extends smoothly from the sidewall 3221 of the second conductive portion 322 to the sidewall 3121 of the first conductive portion 321. The sidewall 3234 of the connecting portion 322 extends smoothly from the sidewall 3222 of the second conductive portion 322 to the sidewall 3121 of the first conductive portion 321. Preferably, each of the sidewalls 3233, 3234 extends smoothly from a tangential direction of the sidewall 3211 correspondingly.

Figure 5:
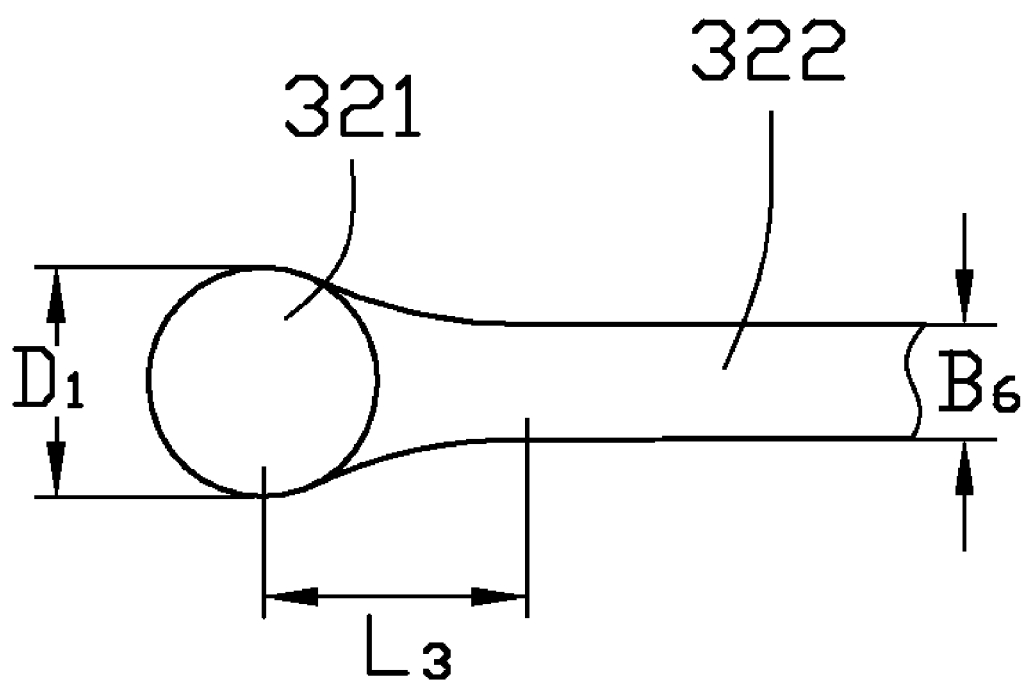
FIG. 5 is a schematic view showing a printed circuit board in accordance with a third embodiment.
Figure 6:
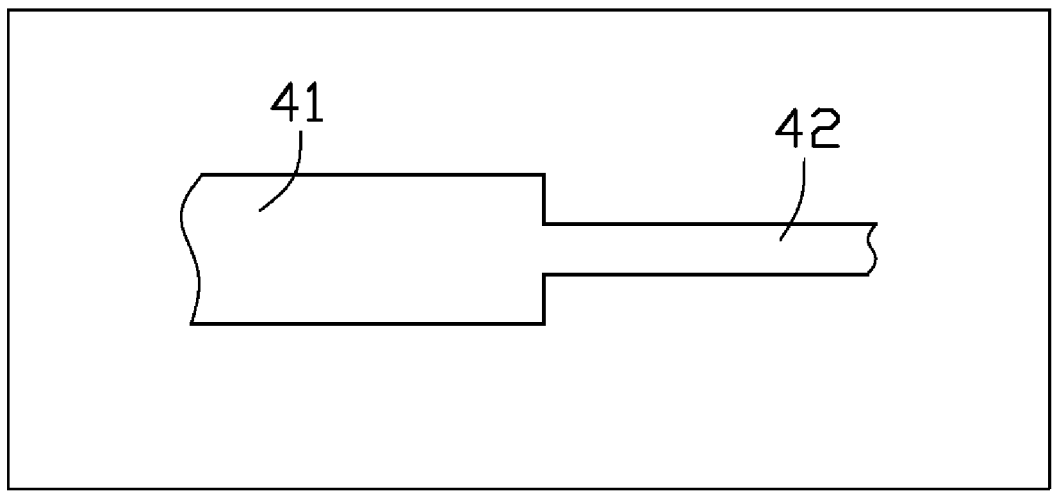
FIG. 6 is a schematic view showing a printed circuit board in accordance with related art.

In the third preferred embodiment, the sidewalls 3233, 3234 are curved shaped. Referring to FIG. 5, the first conductive portion 321 has a diameter of $D_1$. The second conductive portion 322 has a width of $W_6$. The connecting portion 323 has a length of $L_3$. The diameter $D_1$ of the first conductive portion 321 is larger than the width $W_6$ of the second conductive portion 322. The length $L_3$ of the connecting portion 323 is in the range from $1.6*(D_1-W_6)$ to $2.4*(D_1-W_6)$. Preferably, $L_3$ is in the range from $1.8*(D_1-W_6)$ to $2.2*(D_1-W_6)$.

It is to be understood that the above-described embodiments are intended to illustrate rather than limit the invention. Variations may be made to the embodiments without departing from the spirit of the invention as claimed. The above-described embodiments illustrate the scope of the invention but do not restrict the scope of the invention.

What is claimed is:

1. A printed circuit board comprising:
a dielectric layer and a conductive trace formed on the dielectric layer, the conductive trace comprising a first conductive portion, a connecting portion and a second conductive portion, the first conductive portion being a circular shaped welding pad, the second conductive portion being a transmission line, the connecting portion comprising a first end and a second end, the first end being connected to the first conductive portion, the second end being connected to the second conductive portion, wherein a width of the connecting portion gradually decreases from the first end to the second end, the connecting portion comprises two sidewalls, each sidewall extends smoothly from the first conductive portion to the second conductive portion, each sidewall is curved shaped.

2. A printed circuit board comprising:
a dielectric layer and a conductive trace formed on the dielectric layer, the conductive trace comprising a first conductive portion, a connecting portion and a second conductive portion, the first conductive portion being a circular shaped welding pad, the second conductive portion being a transmission line, the connecting portion comprising a first end and a second end, the first end being connected to the first conductive portion, the second end being connected to the second conductive portion, wherein a width of the connecting portion gradually decreases from the first end to the second end, the connecting portion comprises two sidewalls, each sidewall extends smoothly from the first conductive portion to the second conductive portion along a tangential direction of the first conductive portion.

* * * * *